(12) United States Patent
Gonthier et al.

(10) Patent No.: US 6,975,122 B2
(45) Date of Patent: Dec. 13, 2005

(54) PROTECTION OF AN A.C. SWITCH

(75) Inventors: Laurent Gonthier, Tours (FR); Benoît Peron, Tours (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/679,996

(22) Filed: Oct. 7, 2003

(65) Prior Publication Data

US 2004/0066594 A1 Apr. 8, 2004

(30) Foreign Application Priority Data

Oct. 7, 2002 (FR) .................................. 02 12428

(51) Int. Cl.[7] ............................................. G01R 31/08
(52) U.S. Cl. ........................ 324/522; 361/78; 361/79
(58) Field of Search ............................. 324/415, 416, 324/522, 73.1; 361/78, 79

(56) References Cited

U.S. PATENT DOCUMENTS

| | | | |
|---|---|---|---|
| 4,620,258 A | 10/1986 | Bloomer | .................. 361/91.2 |
| 4,835,652 A * | 5/1989 | Billings et al. | ................ 361/79 |
| 6,256,211 B1 * | 7/2001 | Milazzotto et al. | ............ 363/39 |
| 2001/0046143 A1 | 11/2001 | Bruckmann et al. | ..... 363/56.05 |

FOREIGN PATENT DOCUMENTS

| | | |
|---|---|---|
| DE | 196 22 679 A1 | 12/1996 |
| EP | 0 009 649 A1 | 4/1980 |

OTHER PUBLICATIONS

French Search Report from French Patent Application No. 02/12428, filed Oct. 7, 2002.

* cited by examiner

*Primary Examiner*—Vincent Q. Nguyen
(74) *Attorney, Agent, or Firm*—Lisa K. Jorgenson; James H. Morris; Wolf, Greenfield & Sacks, P.C.

(57) ABSTRACT

A circuit for detecting an overcurrent in an element in which an A.C. supply current flows, including a first comparator, assigned to the halfwaves of a first sign of the A.C. power supply, receiving on a reference input a first reference voltage setting a first one of the thresholds, a second comparator, assigned to the halfwaves of a second sign of the A.C. power supply, receiving on a reference input a second reference voltage setting a second one of the thresholds, and an input stage providing, to respective interconnected read inputs of the comparators, a voltage proportional to the voltage across the element, the stage including at least one first resistive element introducing a voltage drop between a first one of the terminals of the element and the read inputs.

20 Claims, 3 Drawing Sheets

PROTECTION OF AN A.C. SWITCH

BACKGROUND OF THE INVENTION

1. Field of the Invention

The present invention generally relates to the protection of switches. More specifically, the present invention relates to the protection of a bidirectional switch upon occurrence of an overcurrent, resulting for example from a short-circuit in a load controlled in A.C. mode by the switch.

2. Discussion of the Related Art

FIGS. 1A and 1B illustrate a known method for protecting a bidirectional switch for controlling an A.C. load against overcurrents.

FIG. 1A schematically and partially illustrates a load 1 series-connected with a bidirectional switch 2 across an A.C. voltage source 3. Bidirectional switch 2 is formed by the anti-series connection, between two terminals A and C, of two insulated-gate bipolar transistors (IGBT) 4 and 5. "Anti-series" means that IGBT transistors 4 and 5 are in series and that their junction point is a common emitter point. Each terminal A and C is then connected to the collector of one of transistors 4 and 5. For clarity, the collector of transistor 4 is designated in the following description of FIG. 1 as "A" and the collector of transistor 5 is designated as "C". The emitter of each of transistors 4 and 5 is connected to its respective collector A, C by a respective diode D1, D2. Each diode D1, D2 is in antiparallel with the junction of its associated transistor 4, 5. Collector A of transistor 4 is connected to a supply terminal of load 1. Collector C of transistor 5 is connected to a terminal of source 3, non-connected to load 1. A circuit 6 for controlling and protecting transistor 4 is connected between its gate G1 and its collector A. Similarly, for transistor 5, another control and protection circuit 7 is connected between its gate G2 and its collector C. The two protection circuits 6 and 7 are identical.

FIG. 1B schematically and partially illustrates a protection circuit (6 or 7, FIG. 1A) connected between a collector A or C and a gate G1 or G2. A control block 10 (CTRL) comprises two supply terminals respectively connected to a high supply rail Vcc and a low supply or ground rail GND connected to the emitter of protected transistor 4 or 5. An output terminal of block 10 is connected to an end of a resistor 11 having another end forming the output terminal of protection circuit 6, respectively 7, connected to gate G1, respectively, G2, of transistor 4, respectively 5. An input terminal of block 10 is connected to an output terminal OUT of a comparator 12. Two supply terminals of comparator 12 are respectively connected to high supply rail Vcc and low supply rail GND. An inverting input IN1 of comparator 12 is connected to a reference D.C. voltage source (V) 13. A non-inverting input IN2 of comparator 12 is connected to high supply rail Vcc, via a biasing resistor 14. Non-inverting input IN2 is also connected to the anode of a diode 15 having its cathode connected to collector A, respectively C, of protected unidirectional switch 4, respectively 5. Circuits 6, respectively 7, ensure their protection function by controlling gate G1, respectively G2, of transistor 4, respectively 5, according to the result of the comparison, by comparator 12, of the current value of the collector-emitter voltage with voltage reference V provided by source 13.

The protection circuit of FIG. 1B enables controlling collector-emitter voltage Vce across protected transistor 4 or 5 by means of comparator 12. Given the current-vs.-voltage characteristic of a transistor, a voltage Vce unusually high as compared to the reference set by source 13 corresponds to the occurrence of an overcurrent, linked to a malfunction of load 1 or of source 3. Diode 15 is a protection diode intended to protect non-inverting (+) input IN2 of comparator 12, especially when protected transistor 4 or 5 is off.

A disadvantage of the structure previously described in relation with FIGS. 1A and 1B is the need to repeat twice a protection circuit of a one-way switch to obtain a bidirectional switch protection circuit.

Another disadvantage of the previous structure is that protection diodes 15 of circuits 6, 7 must be able to hold a high voltage, especially when switch 2 is off. High-voltage diodes are relatively complex and bulky to make in integrated form.

It has previously been considered that bidirectional switch 2 is formed of the anti-series connection of two IGBT transistors, each being associated with a free wheel diode in anti-parallel. However, the same disadvantages are encountered if the transistors are of MOS type.

FIG. 2 schematically and partially illustrates another known embodiment in which bidirectional switch 2 is formed of the antiparallel connection of two IGBT or MOS transistors of same conduction type T1 and T2, each transistor T1, T2 being in series with a respective rectifying diode D3, D4. For clarity, the connection of switch 2 in series with load 1 across A.C. source 3 described in relation with FIG. 1A is indicated only by the mentioning of terminals A and C in FIG. 2. Terminal A is connected to the anode of diode D3, the cathode of which is connected to the collector of transistor T1. Terminal A is also connected to the cathode of diode D4, the anode of which is connected to the emitter of transistor T2. Terminal C is connected to the emitter of transistor T1 and to the collector of transistor T2.

Protection circuit 17 of switch 2 here is comprised of two separate comparators 121 and 122. Non-inverting (+) input IN21 of comparator 121 is connected to the anode of a diode 151 having its cathode connected to the collector of transistor T1 (cathode of diode D3). The inverting (−) input IN11 of comparator 121 receives a reference voltage Vref+, positive with respect to the ground defined by one of the two terminals of switch 2, for example, terminal C, and provided by a voltage source 131.

Non-inverting (+) input IN22 of comparator 122 is connected to the cathode of a diode 152 having its anode connected to the emitter of transistor T2 (anode of diode D4). Inverting (−) input IN12 of comparator 121 receives a reference voltage Vref−, negative with respect to ground GND and provided by a second voltage source 132.

The respective outputs OUT1 and OUT2 of comparators 121, 122 are connected to input terminals of a control circuit (not shown) driving, generally via resistors (not shown), gates G1 and G2 of transistors T1 and T2.

The supply of comparator 121 is ensured by a source 133 of a positive supply voltage +Vcc connected between a supply terminal of comparator 121 and ground GND. Similarly, a source 134 of a negative supply voltage −Vcc is connected between a supply terminal of comparator 122 and ground GND.

The operating principle of protection circuit 17 of FIG. 2 is similar to that of a protection circuit 6, 7 of FIGS. 1A and 1B, voltage Vce of each transistor being compared with a respective reference Vref+, Vref− set by respective source 131 or 132. Diode 151, 152 of each portion of circuit 17 dedicated to the protection of one of the two switches unidirectional in current T1, D3 and T2, D4 is homologous to diode 15 of each circuit 6, 7 of FIG. 1.

A disadvantage of such a structure is the need to provide two voltage reference supply sources 133 and 134.

Another disadvantage of such a structure is the presence of high-voltage diodes 151 and 152.

According to another known method, a read resistor is introduced in series with the load and the bidirectional switch and the occurrence of overcurrents across this resistor is detected. As compared to the diagram of FIG. 2, the two non-inverting inputs of comparators 121 and 122 are then connected to the junction point of the switch and the detection resistor, the other terminal of this resistor being connected to ground, which corresponds to one of the terminals of application of the A.C. supply voltage. Diodes 151 and 152 are then no longer necessary.

SUMMARY OF THE INVENTION

An object of the present invention is to provide a circuit for protecting a bidirectional switch which overcomes the disadvantages of conventional circuits and which, especially, is more easily integrable.

The present invention also aims at providing a circuit such that it does not use a negative independent power supply.

The present invention also aims at providing such a circuit that is common to the two one-way switches forming it.

To achieve these and other objects, the present invention provides a circuit for detecting an overcurrent in an element run through by an A.C. supply current, comprising detecting a variation in the voltage across the element beyond two predetermined thresholds, said circuit comprising:

a first comparator, assigned to the halfwaves of a first sign of the A.C. power supply, receiving on a reference input a first reference voltage setting a first one of said thresholds;

a second comparator, assigned to the halfwaves of a second sign of the A.C. power supply, receiving on a reference input a second reference voltage setting a second one of said thresholds; and an input stage providing, to respective interconnected read inputs of the comparators, a voltage proportional to said voltage across said element, said stage comprising at least one first resistive element introducing a voltage drop between a first one of the terminals of the element and said read inputs.

According to an embodiment of the present invention, the circuit is supplied between a high supply rail and a ground to which is connected one of said terminals of the element not connected to said first resistive element.

According to an embodiment of the present invention, the input stage comprises:

a first series connection of two low-voltage diodes, between said high rail and the ground, the anode of a first diode being grounded while the cathode of a second diode is connected to the high rail; and a second series connection, between said high rail and said ground, of at least two resistive elements, the midpoints of said first and second series connection being interconnected to said read inputs of said first and second comparators.

According to an embodiment of the present invention, said first and second reference voltages are set by at least one resistive dividing bridge formed between said high rail and the ground.

According to an embodiment of the present invention, said first and second reference voltages are set by a single resistive dividing bridge formed of a series connection, between said high rail and said ground, of three resistive elements, said predetermined thresholds being respectively sampled across the intermediary resistor of the bridge.

According to an embodiment of the present invention, outputs of the first and second comparators are combined.

According to an embodiment of the present invention, the outputs are combined by a logic two-input OR gate.

According to an embodiment of the present invention, the that conducts an A.C. supply current is a bidirectional switch.

According to an embodiment of the present invention, the element conducting an A.C. supply current is a resistor.

The present invention also provides a circuit of protection against an overcurrent of a bidirectional switch in the on state, run through by an A.C. supply current.

According to an embodiment of the present invention, said resistor is in series with said switch.

The foregoing objects, features, and advantages of the present invention will be discussed in detail in the following non-limiting description of specific embodiments in connection with the accompanying drawings.

DETAILED DESCRIPTION

Figure 1A:
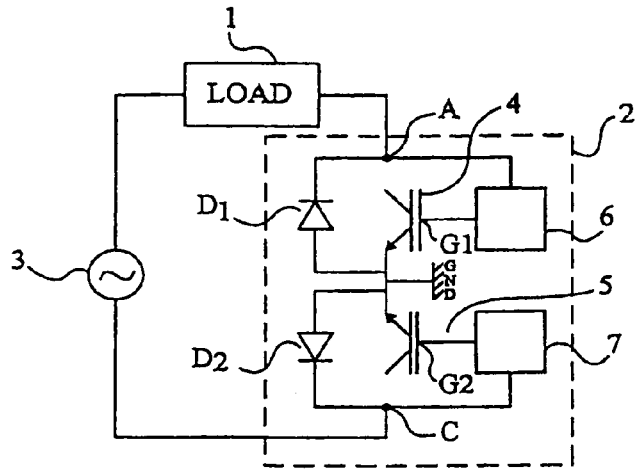
FIGS. 1A and 1B, previously described, illustrate a first conventional mode of switch protection against overcurrents.
Figure 3:
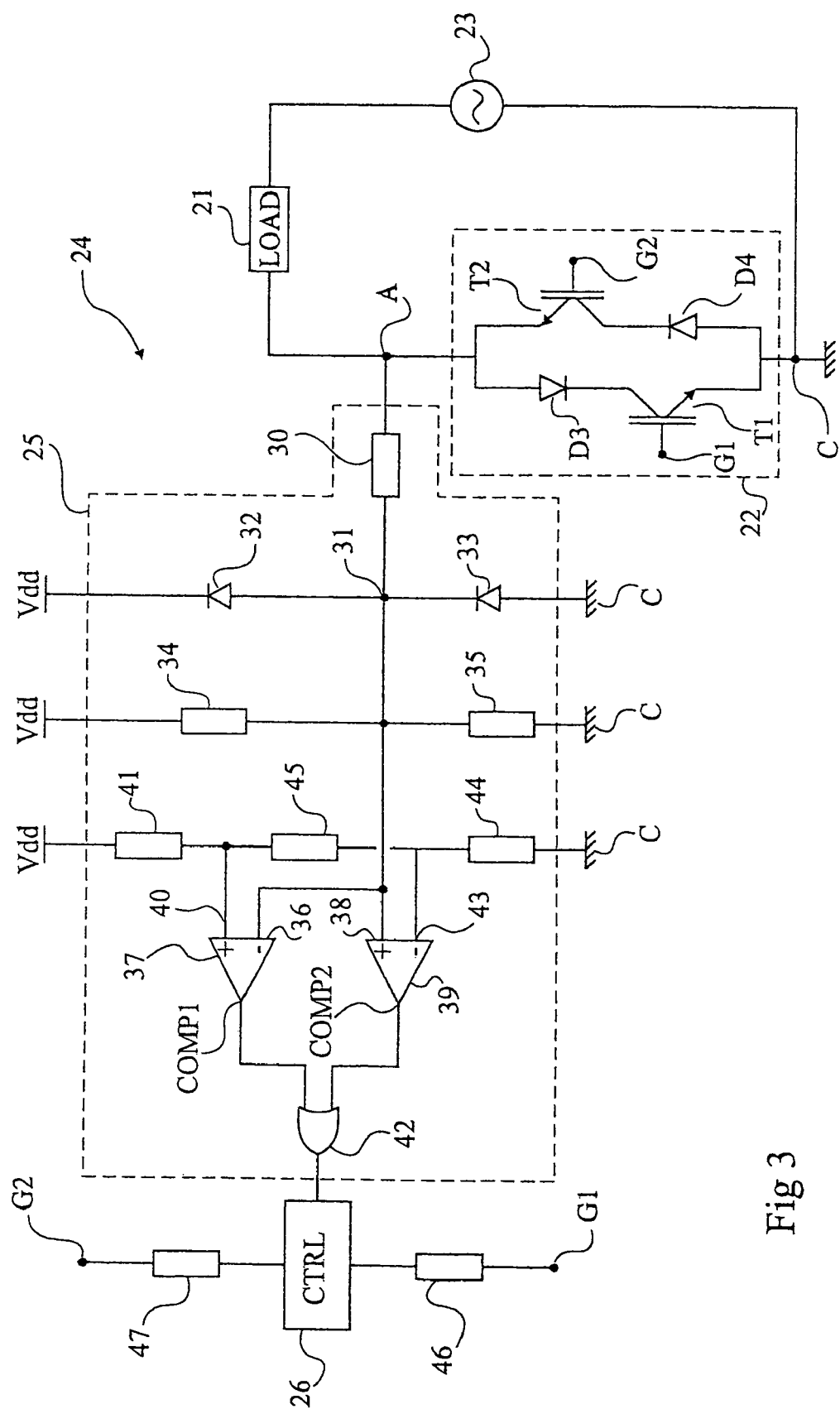
FIG. 3 schematically and partially illustrates an embodiment of the protection of a bidirectional A.C. load control switch against overcurrents according to the present invention.

FIG. 3 schematically and partially illustrates an embodiment of the present invention. A load 21 is connected in series with a bidirectional switch 22 across an A.C. voltage source 23. Bidirectional switch 22 is a switch with two input/output terminals A and C and two control terminals G1 and G2. For example, terminal A is connected to a supply terminal of load 21, terminal C is connected to a terminal of source 23, another terminal of which is connected to another supply terminal of load 21. Hereafter, terminal C forms the low voltage reference or ground point. The structure of switch 22 may be identical to that of switch 2 of FIG. 1A.

According to the embodiment illustrated in FIG. 3, switch 22 is formed of the anti-parallel connection of two switches unidirectional in current. Each unidirectional switch is formed of the series connection, between terminals A and C, of a diode D3, D4 and of a transistor T1, T2.

Figure 2:
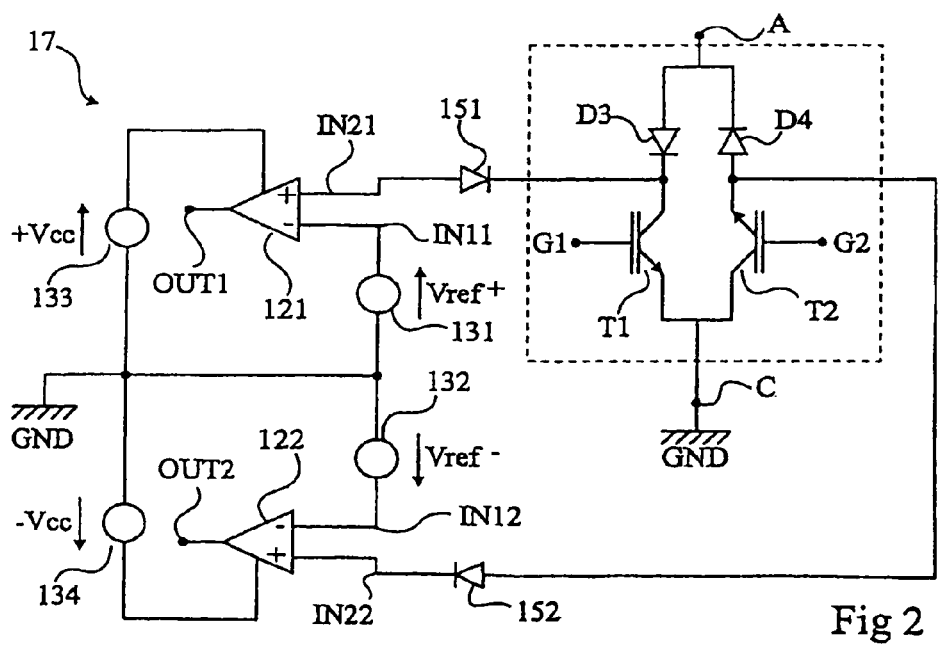
FIG. 2, previously described, illustrates another conventional mode of switch protection against overcurrents.

The series connection in each branch of switch 22 of a transistor T1, T2 with a respective diode D3, D4 may be similar to that of FIG. 2.

According to a preferred embodiment illustrated in FIG. 3, each collector of a transistor T1, T2 is connected to the cathode of its respective rectifying diode D3, D4.

Transistors T1, T2 of the two one-way switches are MOS transistors of the same conduction type or, for example, insulated-gate bipolar transistors (IGBT).

According to the present invention, switch 22 is protected against overcurrents by a single protection circuit 24 with two inputs, respectively connected to terminals A and C, and two output terminals, respectively connected, preferably via a respective protection resistor 46, 47, to control terminals G1 and G2 of switch 22. More specifically, circuit 24 comprises a detection circuit 25 and a control circuit (CTRL) 26.

According to the present invention, detection circuit 25 comprises a resistor 30 having one end forming the input of protection circuit 24 connected to terminal A. Another end of resistor 30 is connected to the midpoint 31 of a series connection, between a high supply rail Vdd and the ground, of two low-voltage diodes 32 and 33. The anode of diode 33 is grounded while the cathode of diode 32 is connected to rail Vdd.

Midpoint 31 is connected to the midpoint of a series connection, also between high rail Vdd and the ground, of two resistors 34 and 35. Midpoint 31 is also connected, on the one hand, to an inverting (−) read input 36 of a first comparator 37 and, on the other hand, to a non-inverting (+) read input 38 of a second comparator 39.

A non-inverting (+) input 40 of comparator 37 forms a reference input connected, via a resistor 41, to high rail Vdd. Output COMP1 of comparator 37 is connected to a first one of two inputs of an OR gate 42. An inverting (−) input 43 of comparator 39 forms a reference input connected, via a resistor 44, to ground. Output COMP2 of second comparator 39 is connected to a second input of gate 42.

Preferably, an intermediary resistor 45 is connected between the non-inverting (+) input 40 of first comparator 37 and the inverting (−) input 43 of second comparator 39. The values of resistors 41, 44, and 45 of reference inputs 40, 43 are adjusted so that the high threshold of first comparator 37 is greater than the low threshold of second comparator 39. As an alternative, series resistors 41, 44, and 45 may be replaced with resistive voltage dividers respectively assigned to inputs 40 and 43 of comparators 37 and 39. An advantage of the embodiment of FIG. 3 however is to link together the operating range thresholds so that they undergo the same possible drifts, resistor 45 guaranteeing the separation between thresholds.

The output of gate 42 forms the output of detection circuit 25 and is connected to an input of control circuit 26.

For simplification and clarity, as will be understood by those skilled in the art, it has been omitted to show the supplies Vcc of comparators 37 and 39 and of control circuit 26 in FIG. 3.

In normal operation, load 21 conducts an A.C. current predetermined by its nature and/or its operating mode, the A.C. voltage between terminals A and C of on switch 22 is very small (due to the series resistance of switch 22 in the on state) as compared to the A.C. voltage provided by source 23. The values of the different input resistances 30, 34, and 35 are set so that the voltage signal applied on inverting 36 and non-inverting 38 input of the first 37 and second 39 comparators, respectively remains within a voltage range between the thresholds set by resistors 41, 44, and 45. Then, the voltage signal transmitted by input resistor 30 is such that, for both comparators 37 and 39, the low-voltage signal on their non-inverting input is always (in normal operation) greater than the low-voltage signal on their inverting input. Outputs COMP1 and COMP2 then take a same logic state. Detection circuit 25 thus provides control circuit 26 with a signal of a first logic value. Control circuit 26 is designed to ensure, as a response to this first logic value, the holding of switch 22 in the on state.

Upon occurrence of an overcurrent, generally linked to a malfunction of load 21 or of source 23, as soon as the image of the voltage between terminals A and C of switch 22 comes out of the acceptable voltage range set by the thresholds of comparators 37 and 39 and an attenuation coefficient linked to the presence of resistors 30, 34, and 35, one of comparators 37 and 39 switches states. This low-voltage image is obtained due to the arrangement of the input stage formed of resistors 30, 34, and 35 and of diodes 32 and 33 which are used to limit the voltage at midpoint 31 within a range from Vdd+VD32 to GND−VD33, when switch 22 is off, VD32 and VD33 begin the voltage drop introduced by the respective diode 32 and 33. In the case of a positive halfwave, the detection is performed in the case where the high threshold of reference input (+) 40 is exceeded. In the case of a negative halfwave, the detection is performed in the case where it is fallen below the low threshold of the reference input 43 (−). The corresponding switching of a single input of gate 42 causes a switching of the output of this gate. Control circuit 26 then receives a second logic value complementary to the first one. Control circuit 26 is designed to modify, as a response to this second logic value, the control of gates G1 and G2 to turn off switch 22.

An advantage of the present invention is to provide a circuit of protection against overcurrents of a bidirectional switch controlling an A.C. load easier to integrate than known circuits. Indeed, the detection circuit according to the present invention, conversely to known circuits, requires no additional negative power supply.

Further, one and the same circuit connected across a bidirectional switch advantageously enables protecting two controllable one-way switches forming it.

Another advantage of the present invention is that the detection and protection circuits according to the present invention are advantageously usable with anti-parallel type switches as well as with anti-series type switches. For an anti-series assembly, a shunt should however be used (for example, a resistor) between the two switches.

Further, the detection circuit according to the present invention may advantageously be used with a so-called MBS-type bidirectional switch which exhibits the antiparallel structure of the drawing, in which the cathode of diode D3, D4 is connected to the collector of the associated transistor T1, T2. On the contrary, the known detection and protection circuit of FIG. 2 could not be used with such an MBS bidirectional switch. Indeed, for protection circuit 17 of FIG. 2, input terminal IN22 of comparator 122 must be connected to the emitter of transistor T2. In the case of a bidirectional MBS switch, such a connection results in directly connecting terminal A and the anode of diode 152. As illustrated in FIG. 2, input IN22 must be protected by interposing diode D4 between terminal A and the anode of diode 152. This has a double advantage, on the one hand, that the circuit according to the present invention may be used with more switches than in the state of the art. On the other hand, MBS-type switches are easier to form in terms of integration.

The values of the different resistances 30, 34, 35, 41, 44, and 45 are set, on the one hand, to enable detection of an overcurrent according to the previously-discussed principles. On the other hand, the values of resistances 30, 34, and 35 are also set to limit, when switch 22 is off, the parallel leakage current of switch 22 as well as the power dissipated in resistors 30, 34, 35, 41, 44, and 45.

As a specific example of implementation, the following values will be set for the resistors:

resistor 30: $1.10^6 \Omega$;
resistor 34: $1.3.10^6 \Omega$;
resistor 35: $360.10^3 \Omega$;
resistor 41: $47.10^3 \Omega$;
resistor 44: $4.3.10^3 \Omega$; and
resistor 45: $13.10^3 \Omega$.

In this case, for an A.C. voltage supplied by source 23 of 220 V, the thresholds of comparators 37 and 39 are on the order of 4 volts and 1 volt, respectively, which enables detecting the occurrence of an overcurrent as soon as the collector-emitter voltage Vce across a transistor T1 or T2 exceeds, in absolute value, 7 volts.

Figure 1B:
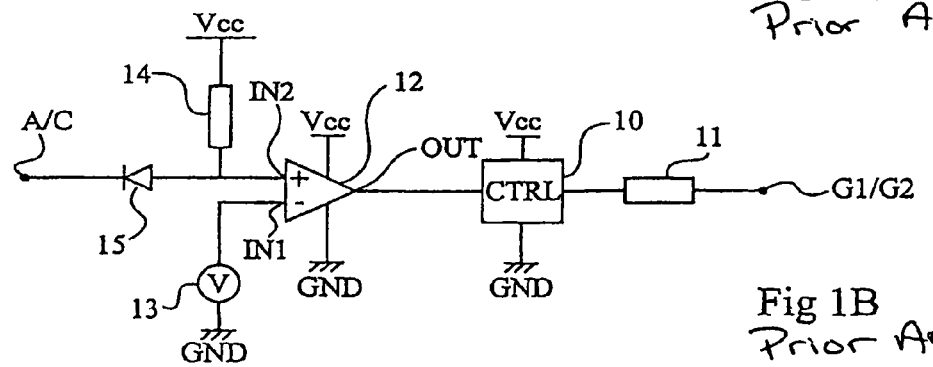

Further, diodes 32 and 33 are low-voltage diodes. They are thus easier to form and less bulky in integrated form than homologous high-voltage diodes (15, FIG. 1B) of known circuits. Indeed, the diodes according to the present invention are connected to low voltage power supply Vdd. Conversely to protection diodes of known circuits, they are not intended to protect the protection circuits when the switch is off, that is, when the voltage thereacross is high. Further, upon occurrence of an overcurrent, diodes 32 and 33 are protected in current by input resistor 30.

As will be understood by those skilled in the art, the detection circuit of according to the present invention is not limited to a detection of an overcurrent across a bidirectional switch.

Figure 4:
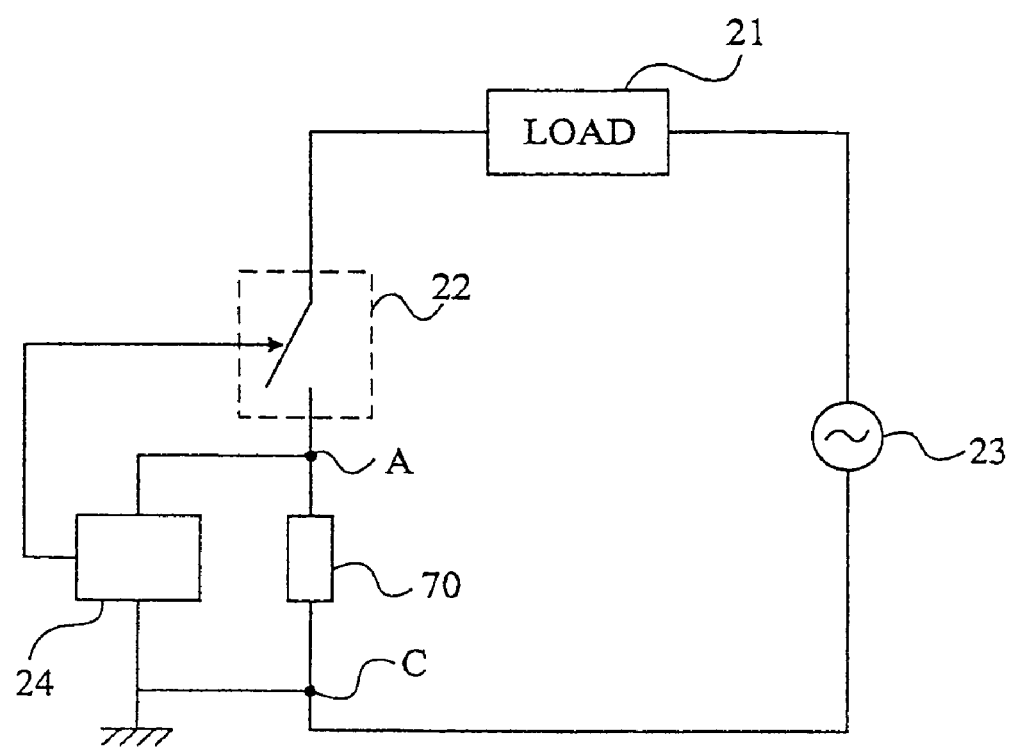
FIG. 4 schematically and partially illustrates another embodiment of the of a bidirectional A.C. load control switch against overcurrents according to the present invention.

Thus, FIG. 4 schematically and partially illustrates another embodiment of the protection of a bidirectional switch 22 for controlling an A.C. load 21 supplied by an A.C. source 23. This embodiment differs from that of FIG. 3 in that protection circuit 24 according to the present invention now is connected across a resistor 70 series-connected with switch 22 and load 21 across source 23. The ground indicated in FIG. 4 as corresponding to terminal C may however, as an alternative, correspond to terminal A.

Of course, the present invention is likely to have various alterations, modifications, and improvements which will readily occur to those skilled in the art. In particular, the present invention has been described hereabove as applied to a specific bidirectional switch. However, the present invention also applies to a bidirectional switch formed of the anti-series connection of two controllable switches unidirectional in current connected in anti-parallel to respective free wheel diodes. Further, it has been considered in the foregoing description that the one-way switches are IGBT transistors. The one-way switches may however be N- or P-channel MOS transistors, connected in series or in anti-parallel. Further, specific circuit elements may be replaced with functionally equivalent elements. In particular, it will be within the abilities of skilled in the art to select a control circuit 26 capable of appropriately driving of the control terminals of switch 22. Similarly, the comparison function described in relation with comparators 37 and 39 may be carried out by any appropriate circuit.

Further, it has been considered in the description of the present invention that the switch controls the supply of a load placed in series with the switch. However, the switch could be placed in parallel with the load and control its supply according to a predetermined cycle, for example, according to the voltage thereacross.

Moreover, load 21 may be any A.C.-supplied bidirectional load. In particular, the load may especially be a resistive element, for example, in lighting or heating devices.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit for detecting an overcurrent in an element through which an A.C. supply current flows, comprising detecting a variation in the voltage between the terminals of the element beyond two thresholds, said circuit comprising:
   a first comparator, assigned to the halfwaves of a first sign of the A.C. power supply, receiving on a reference input a first reference voltage setting a first one of said thresholds;
   a second comparator, assigned to the halfwaves of a second sign of the A.C. power supply, receiving on a reference input a second reference voltage setting a second one of said thresholds; and
   an input stage providing, to respective interconnected read inputs of the comparators, a voltage proportional to said voltage across said element, said stage comprising at least one first resistive element introducing a voltage drop between a first one of the terminals of the element and said read inputs.

2. The detection circuit of claim 1, supplied between a high supply rail and a ground to which is connected one of said terminals of the element not connected to said first resistive element.

3. The detection circuit of claim 2, wherein the input stage comprises:
   a first series connection of two low-voltage diodes, between said high rail and the ground, the anode of a first diode being grounded while the cathode of a second diode is connected to the high rail; and
   a second series connection, between said high rail and said ground, of at least two resistive elements, the midpoints of said first and second series connections being interconnected to said read inputs of said first and second comparators.

4. The detection circuit of claim 2, wherein said first and second reference voltages are set by at least one resistive dividing bridge formed between said high rail and the ground.

5. The detection circuit of claim 4, wherein said first and second reference voltages are set by a single resistive dividing bridge formed of a series connection, between said high rail and said ground, of three resistive elements, said thresholds being respectively sampled across the intermediary resistor of the bridge.

6. The detection circuit of claim 1, wherein outputs of the first and second comparators are combined.

7. The detection circuit of claim 6, wherein the outputs are combined by a logic two-input OR gate.

8. The detection circuit of claim 1, wherein the element that conducts an A.C. supply current is a bidirectional switch.

9. A circuit of protection against an overcurrent of a bidirectional switch in the on state, conducting an A.C. supply current, and comprising the detection circuit of claim 8.

10. The detection circuit of claim 1, wherein the element that conducts an A.C. supply current is a resistor.

11. A circuit of protection against an overcurrent of a bidirectional switch in the on state, comprising the detection circuit of claim 9, said resistor being in series with said switch.

12. A circuit for detecting an overcurrent in an element through which an A.C. supply current flows, comprising:
   a first comparator, responsive to a first polarity of the A.C. supply, receiving on a reference input a first reference voltage that sets a first threshold;
   a second comparator, responsive to a second polarity of the A.C. supply, receiving on a reference input a second reference voltage that sets a second threshold;

and input stage providing, to respective interconnected read inputs of the comparators, a voltage proportional to a voltage across the element, the input stage comprising at least one first resistive element introducing a voltage drop between a first one of the terminals of the element and the read inputs.

13. The detection circuit of claim 12, wherein the input stage comprises:
   a first series connection of two low-voltage diodes, between said high rail and the ground, the anode of a first diode being grounded while the cathode of a second diode is connected to the high rail; and
   a second series connection, between said high rail and said ground, of at least two resistive elements, the midpoints of said first and second series connections being interconnected to said read inputs of said first and second comparators.

14. The detection circuit of claim 12, wherein outputs of the first and second comparators are combined.

15. The detection circuit of claim 14, wherein the outputs are combined by a logic two-input OR gate.

16. The detection circuit of claim 12, wherein the element that conducts an A.C. supply current is a bidirectional switch.

17. The detection circuit of claim 12, wherein the element that conducts an A.C. supply current is a resistor.

18. The detection circuit of claim 12, supplied between a high supply rail and a ground to which is connected one of said terminals of the element not connected to said first resistive element.

19. The detection circuit of claim 18, wherein said first and second reference voltages are set by at least one resistive dividing bridge formed between said high rail and the ground.

20. The detection circuit of claim 19, wherein said first and second reference voltages are set by a single resistive dividing bridge formed of a series connection, between said high rail and said ground, of three resistive elements, said thresholds being respectively sampled across the intermediary resistor of the bridge.

* * * * *